(12) United States Patent
Kurtz

(10) Patent No.: US 6,861,276 B2
(45) Date of Patent: Mar. 1, 2005

(54) METHOD FOR FABRICATING A SINGLE CHIP MULTIPLE RANGE PRESSURE TRANSDUCER DEVICE

(75) Inventor: Anthony D. Kurtz, Ridgewood, NJ (US)

(73) Assignee: Kulite Semiconductor Products, Inc., Leonia, NJ (US)

( * ) Notice: Subject to any disclaimer, the term of this patent is extended or adjusted under 35 U.S.C. 154(b) by 0 days.

(21) Appl. No.: 10/464,391

(22) Filed: Jun. 17, 2003

(65) Prior Publication Data

US 2003/0214003 A1 Nov. 20, 2003

Related U.S. Application Data

(62) Division of application No. 10/010,975, filed on Dec. 6, 2001, now Pat. No. 6,642,594.

(51) Int. Cl.[7] .............................................. H01L 21/00
(52) U.S. Cl. .............................. 438/48; 438/53; 73/721
(58) Field of Search .......................... 73/721, 724, 727; 438/48, 50, 52, 53

(56) References Cited

U.S. PATENT DOCUMENTS

| 4,040,172 A | | 8/1977 | Kurtz et al. ................. 29/580 |
|---|---|---|---|
| 4,445,383 A | * | 5/1984 | Binder et al. ................. 73/718 |
| 5,286,671 A | | 2/1994 | Kurtz et al. |
| 5,333,504 A | * | 8/1994 | Lutz et al. .................... 73/727 |
| 5,428,855 A | * | 7/1995 | Li ................................. 15/23 |
| 5,614,678 A | | 3/1997 | Kurtz et al. ................. 73/727 |
| 6,058,781 A | * | 5/2000 | Kusuyama et al. .......... 73/724 |
| 2001/0001550 A1 | * | 5/2001 | Bryzek et al. .............. 338/36 |

* cited by examiner

*Primary Examiner*—Tuan H. Nguyen
(74) *Attorney, Agent, or Firm*—Plevy Howard & Darcy PC

(57) ABSTRACT

A single chip multiple range pressure transducer device including a wafer having a plurality of simultaneously formed thinned regions. The thinned regions are separated by a fixed portion, and each have a same minimum thickness. The thinned regions have at least one different planar dimension. A plurality of piezoresistive circuits are formed on the wafer. Each of the circuits is associated with and at least partially formed above one of the thinned regions. The thinned regions deflect a different amount upon application of a common pressure thereto, whereby, when excited each of the circuits provides an output indicative the common pressure over a different operating range when the associated thinned region deflects.

5 Claims, 6 Drawing Sheets

METHOD FOR FABRICATING A SINGLE CHIP MULTIPLE RANGE PRESSURE TRANSDUCER DEVICE

This application is a divisional of U.S. patent application Ser. No. 10/010,975, filed Dec. 6, 2001 now U.S. Pat. No. 6,642,594.

FIELD OF INVENTION

The present invention relates to pressure transducers, and more particularly to piezoresistive pressure transducers adapted to be operable over a wide range of applied pressures.

BACKGROUND OF INVENTION

It is known to be desirable to measure a wide range of pressures using a single pressure transducer device. It is also known that piezoresistive pressure transducers adapted to measure relatively large pressures disadvantageously suffer from a relatively poor resolution or sensitivity when measuring relatively low pressures. That is, as the span of a sensor increases, the resolution or sensitivity of that sensor at the low end of the span decreases. An example of such a piezoresistive sensor is taught in commonly assigned U.S. Pat. No. 5,614,678, entitled "HIGH PRESSURE PIEZORESISTIVE SENSOR" and issued Mar. 25, 1997, the entire disclosure of which is hereby incorporated by reference. The reference also includes in the art cited, many other patents concerning pressure transducers to the assignee hereof.

Referring to FIGS. 4A–4C, the first steps in fabricating a piezoresistive pressure transducer according to the '678 patent are depicted therein. The details of these processing steps are described in commonly assigned U.S. Pat. No. 5,286,671 entitled "FUSION BONDING TECHNIQUE FOR USE IN FABRICATING SEMICONDUCTOR DEVICES", the entire disclosure of which is also incorporated herein by reference. Referring first to FIG. 4A, a pattern wafer 40, which may be made of a single crystal semiconducting material 44 such as N-type silicon, is selected. Such wafers are commercially available and are well known in the art. The wafer 40 has high conductivity P+ (or P++) silicon areas 42 which have been created by diffusion using oxide and/or nitride masking and photolithography for example. After the diffusion process, the surface of the wafer 40 is treated with a conductivity-selective etch which does not attack the P+ (or P++) areas, leaving them raised from the surface as shown in FIG. 4A.

Referring now to FIG. 4B, there is shown a carrier wafer 50, which will eventually form the diaphragm of the transducer. Semiconducting material 53 is lightly doped N- or P-type silicon. An oxide layer 52 is grown on a surface of the wafer 53 using any well known oxidation technique. A typical technique for providing an oxide layer on a silicon substrate is implemented by heating the wafer 50 to a temperature of between 1000°–1300° C. and passing oxygen over the surface of the substrate 53. The passivating oxide layer 52 in this case is silicon dioxide.

Referring now to FIG. 4C, the next step in the procedure is depicted. As shown therein, the pattern wafer 40 of FIG. 4A which contains the piezoresistive sensing elements 42 has been bonded to the carrier wafer 50 of FIG. 4B to form a composite wafer 55. The bonding process is performed in accordance with the preferred fusion bonding technique disclosed in the incorporated '671 patent. The technique described herein mimics that disclosed in the '671 patent and utilizes the earlier described P+(or P++) doped semiconducting material 42 of the pattern wafer 40 and the oxide layer 52 of the carrier wafer 50 as bonding layers. Typical bonding conditions which join the two wafers together are temperatures of between 900°–1000° C. and times of between 5 and 10 minutes.

Referring now to FIG. 4D, it can be seen that the N-type silicon layer of the pattern wafer 40 has been removed entirely down to the P+ (or P++) piezoresistive sensing elements 42 in a selective conductivity etching process which uses the oxide layer 52 of the carrier wafer 50 as an etch stop. Such selective conductivity etching processes are well known in the art and operate by means of etchants which selectively attack the low conductivity N-type material without etching or in any manner attacking the high conductivity P+ (or P++) layers. After this etching process, the raised pattern of P+ (or P++) piezoresistive sensing elements 42 is left bonded to the dielectrically isolating layer 52 of the carrier wafer 50.

Referring now to FIG. 4E, the next step in the procedure is depicted. The semiconducting material 53 of the carrier wafer 50 is preferably a single crystal (100) semiconductor material which may be etched on the side opposite the sensing elements 42 using an isotropic or anisotropic etching technique. Both isotropic and anisotropic etching techniques are commonly practiced, and familiar to those skilled in the art. The etching process forms an aperture 68, which defines the active 64 and non-active 54 diaphragm areas. The thickness or vertical dimension of the active diaphragm area 64 may be of any desired dimension depending upon the length of time that the etching process is allowed to take place. The aperture 68 is preferably etched such that some of the sensing elements 42 are positioned above the non-active or fixed diaphragm area 54, and others are positioned above the active or deflecting diaphragm area 64. Those sensing elements positioned above the non-deflecting diaphragm region are designated outer sensing elements 47, while those sensing elements positioned above the deflecting diaphragm region are designated inner sensing elements 48. The sensing elements 47, 48 are preferably electrically coupled together in a Wheatstone bridge configuration as is well understood.

Referring now to FIG. 4F, there is shown the completed high pressure piezoresistive pressure transducer device 60. The carrier wafer 50, with the etched out aperture region 68 is secured to a supporting member 66. The supporting member 66 may be fabricated from single crystal silicon or may be glass, for example. Of course, other suitable supporting materials can be used. The bonding of the supporting member 66 to the carrier wafer 50 may be accomplished by means of an anodic bonding technique such as the one described in U.S. Pat. No. 4,040,172 entitled "METHOD OF MANUFACTURING INTEGRAL TRANSDUCER ASSEMBLIES APPLYING BUILT IN PRESSURE LIMITING" issued to Anthony D. Kurtz et al. and assigned to Kulite Semiconductor Products, Inc., the assignee herein. The entire disclosure of the '172 patent is also incorporated herein by reference. The bond is typically formed by applying a high electrical voltage through the composite structure under low pressure and temperature, thus bonding the carrier wafer 50 to the supporting member 66 and completing the device. The central region 70 of the diaphragm area 64 and member 66 cooperatively serve as an overpressure stop when exposed to an overpressure which overly-deflects the active area 64 towards the support member 66.

As set forth though, such a fabricated transducer can suffer from the aforementioned drawbacks. Accordingly it is an object of the present invention to provide a single chip multiple range pressure transducer operable over a broad range of pressures and which provides a high degree of sensitivity when being subjected to relatively low pressures.

SUMMARY OF THE INVENTION

A single chip multiple range pressure transducer device including: a wafer including a plurality of simultaneously formed thinned regions separated by a fixed portion, each of the thinned regions having a same minimum thickness but of at least one different planar dimension; and, a plurality of piezoresistive circuits formed on the wafer, each of the circuits being associated with and at least partially formed above one of the thinned regions; wherein, the thinned regions deflect a different amount upon application of a common pressure thereto, whereby, when excited each of the circuits provides an output indicative the common pressure over a different operating range when the associated thinned region deflects.

BRIEF DESCRIPTION OF THE FIGURES

The advantages and aspects of the present invention will be more fully understood in conjunction with the following detailed description and accompanying drawings, wherein.

DETAILED DESCRIPTION OF THE INVENTION

Figure 1:
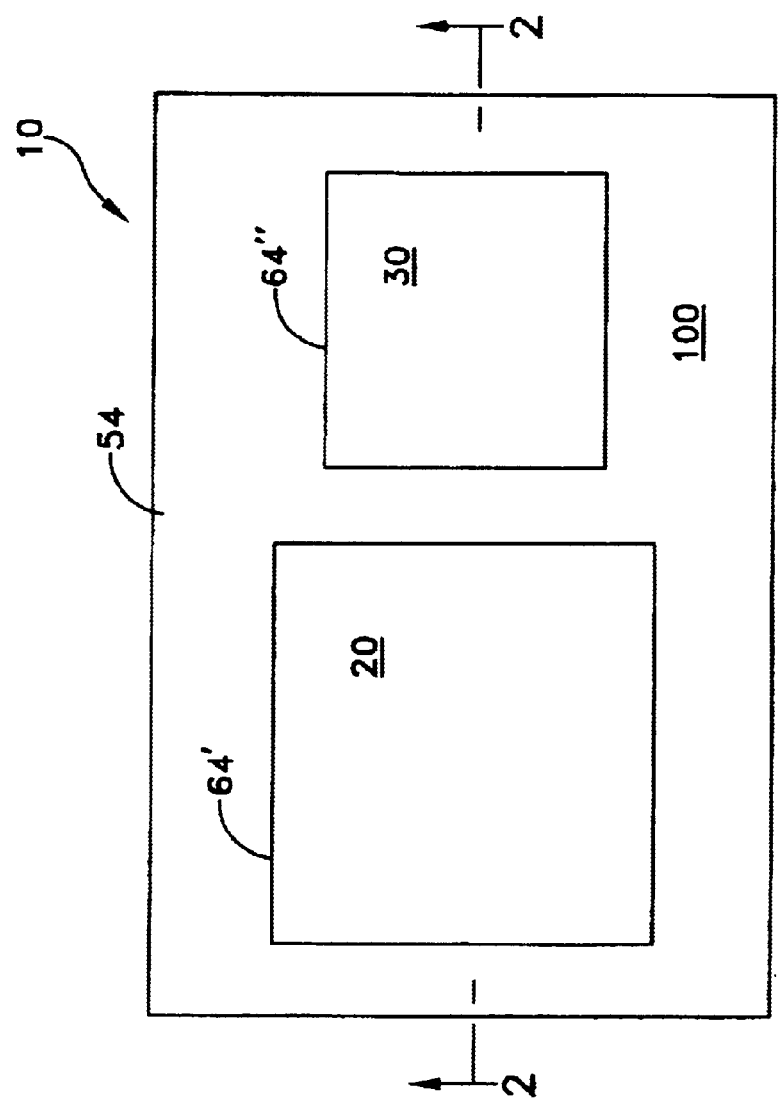
FIG. 1 illustrates a plan view of a sensor chip according to the present invention.
Figure 2:
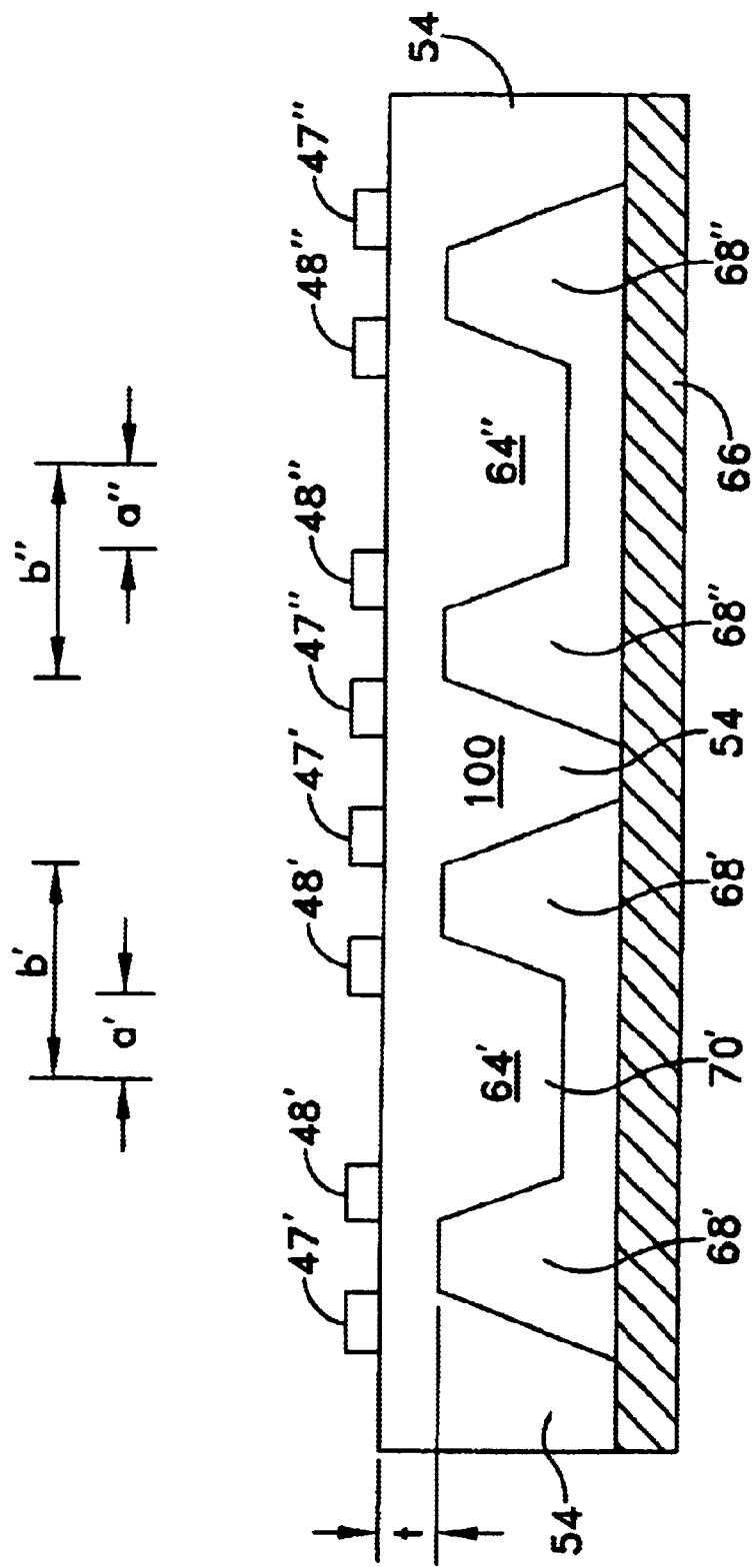
FIG. 2 illustrates cross-section 2—2 of the sensor chip of FIG. 1.

Referring now to FIGS. 1 and 2, like references designate like elements of the invention. Therein is illustrated a single chip multiple range pressure transducer 10 according to a preferred form of the present invention. Basically, the transducer 10 includes multiple, in the illustrated case two, independently deflectable diaphragms 20, 30 of sufficiently different dimensions such that the outputs from circuit configurations of piezoresistors respectively formed thereon provide outputted signals over sufficiently differing measurement spans.

Figure 4A:
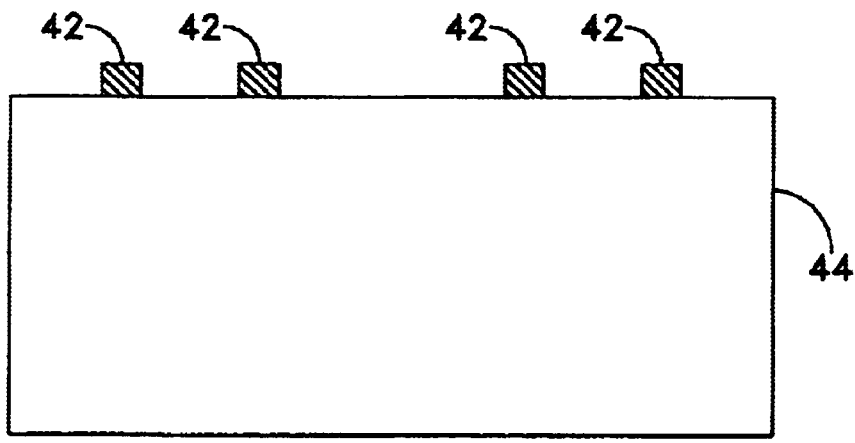
FIGS. 4A–4E depict cross-sectional views illustrating prior art various process steps of fabricating the improved high pressure transducer device; and, FIG. 4F depicts a cross-sectional view through a prior art completed high pressure piezoresistive pressure transducer device constructed in accordance with the teachings discussed regarding FIGS. 4A–4E.
Figure 4B:
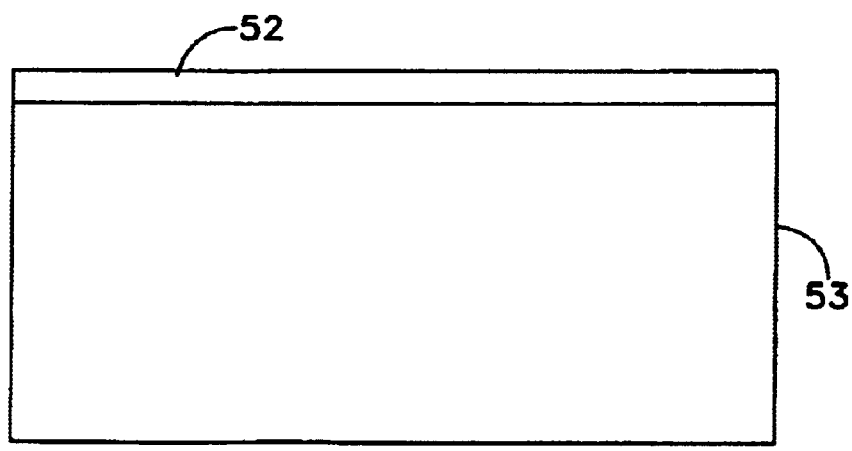
Figure 4C:
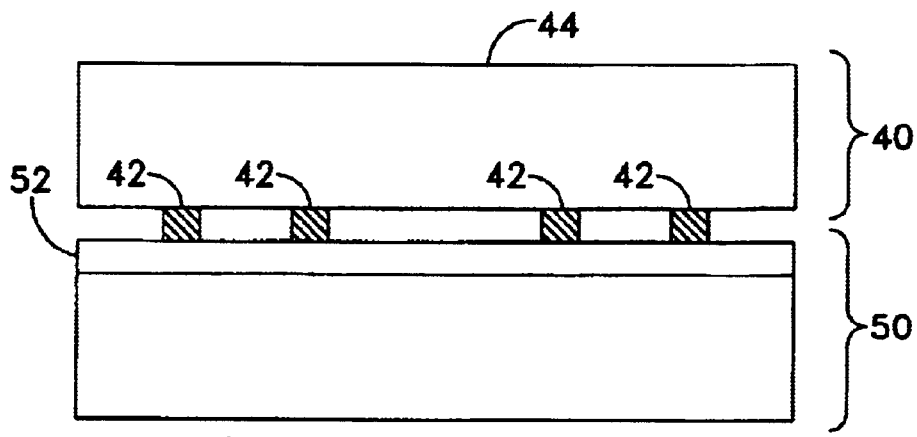
Figure 4D:
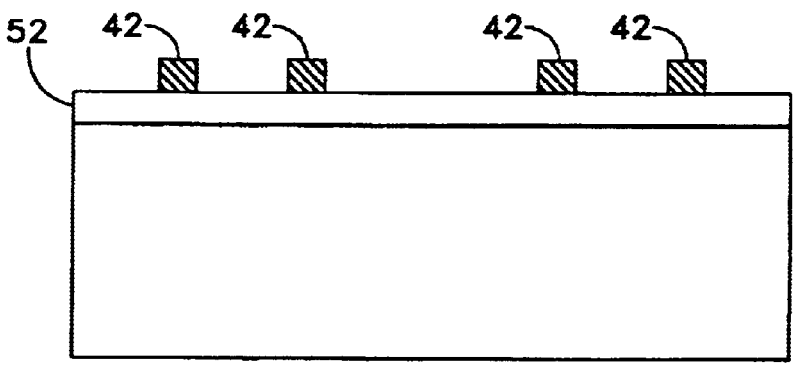
Figure 4E:
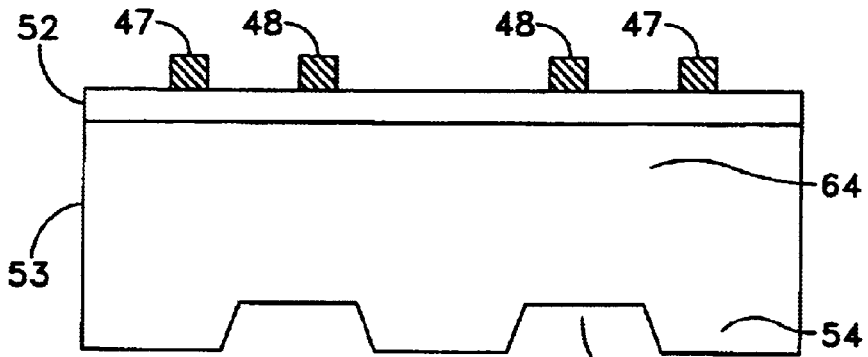
Figure 4F:
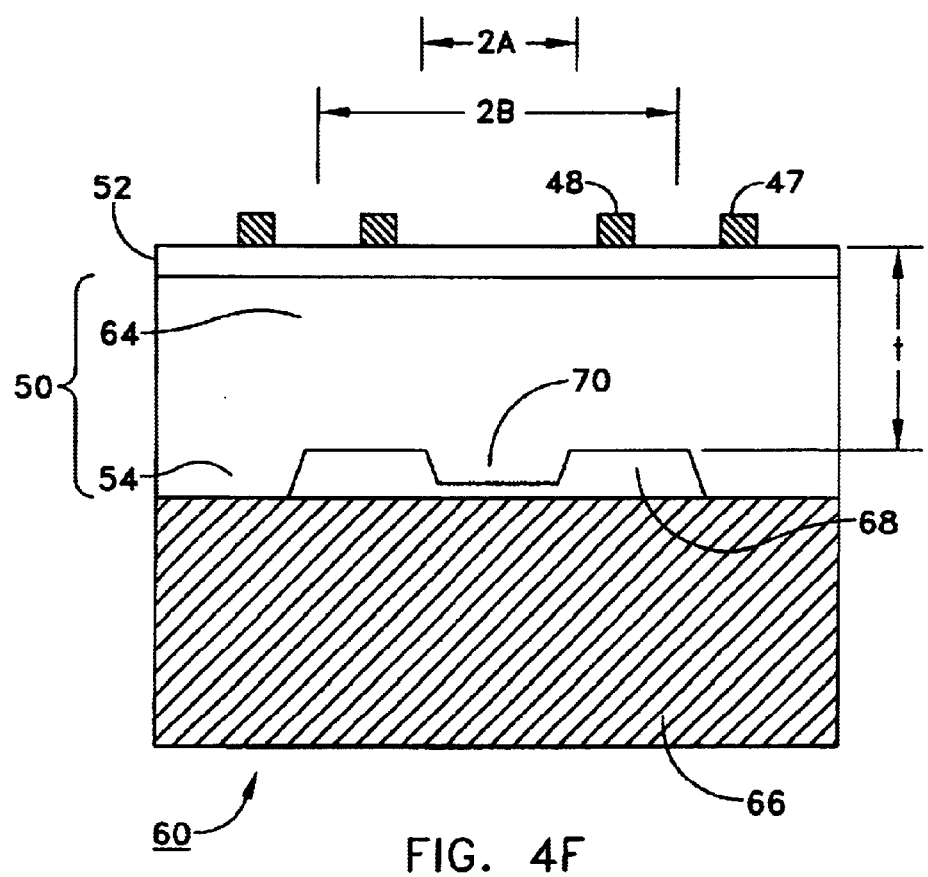

More particularly, and referring also to FIGS. 2 and 4F, it is known $$\text{Max\_y} = \frac{3W(m^2-1)}{4\pi m^2 E t^2}\left[a^2 - b^2 - \frac{4a^2b^2}{a^2-b^2}\left(\log\frac{a}{b}\right)^2\right]$$

where y is the vertical deflection of the diaphragm from the original position, W is the total applied load, m is the reciprocal of Poisson's ratio, E is modulus of elasticity, t is thickness of the diaphragm, b is the dimension of the load bearing portion of the diaphragm, a is the total dimension of the of the diaphragm in the same direction, and the logarithm is to the base e. This provides the maximum (MAX) deflection of the diaphragm 64 when a force is applied thereto. Hence, to adjust the maximum deflection of the diaphragm and hence the span of the sensor, the dimensions a and b and/or the thickness t of the diaphragm 64 can be adjusted.

According to the present invention, by varying the dimensions a and b of diaphragms 64', 64", but not varying the thickness of the two diaphragms 64', 64" with respect to one another, the two diaphragms 64', 64" can be advantageously simultaneously formed using a single piece of silicon, by using the above-identified manufacture method for example. By adjusting the dimensions a and b of the deflectable diaphragm of one of the sensors 20, 30 as compared to the other of the sensors 20, 30, it has been discovered that different operational spans can be achieved using the simultaneously formed sensor chip 10. That is, over a first operational span one of the sensors 20, 30 provides a suitable output based upon well understood design criteria while over another operational span the other of the sensors 20, 30 provides a suitable output.

Referring still to FIG. 2, therein is illustrated cross-section 2—2 of the chip 10 of FIG. 1. Two sensors 20, 30 separated by a fixed portion 100 of non-active area 54 are illustrated therein. The sensors 20, 30 are formed using single silicon layer 53 analogously to the process described above. The sensor 20 includes a deflectable diaphragm defined by the active area 64' and having dimensions a' and b'. The sensor 30 includes a deflectable diaphragm defined by the active area 64" and having dimensions a" and b". Hence the relationship of dimensions a' and b' to a" and b" defines the difference in operational spans between the sensors 20 and 30, as the respective minimum thicknesses thereof are uniform.

More particularly, when a' and b' are greater than a" and b", the diaphragm of the sensor 20 will deflect more in response to application of a given pressure than will the diaphragm of the sensor 30. Hence, the resolution or sensitivity of the sensor 20 is greater than that of the sensor 30 for lower applied pressures. However, the upper-operational threshold of the sensor 20 is less than that of the sensor 30 for the same reasons, as the overpressure stop 70' comes into effect. Hence, deflection of the diaphragm of sensor 20 will be stopped prior to that of the sensor 30 as the stop 70' comes to rest against the supporting member 66. Accordingly, the sensor 30's operational span includes higher pressures than that of the sensor 20. By selectively applying the outputs of the sensors 20, 30 based upon signals received therefrom, a multiple range device using a single chip is attainable. For example, the output from sensor 20 can be selected to be used until a threshold output therefrom is attained. For outputs greater than or equal to the threshold, the output from the sensor 30 can be used. This can be accomplished using any conventional means of selecting between the outputted signals from the sensors 20, 30, such an Application Specific Integrated Circuit (ASIC) which compares the outputs to the threshold and selects between them appropriately, or a suitably programmed microprocessor.

Of course, any number of sensors can be advantageously incorporated in this manner into a single chip.

Figure 3:
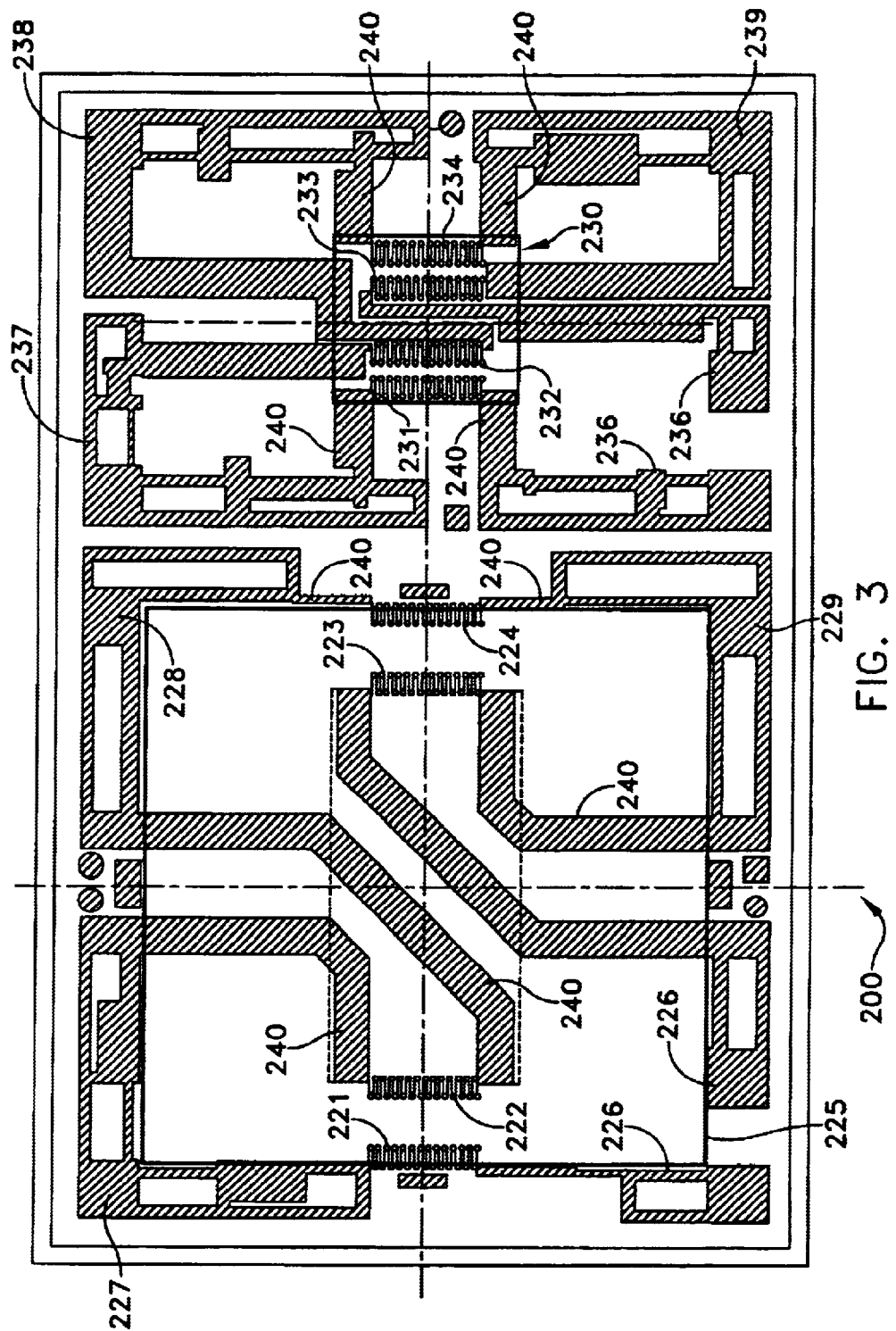
FIG. 3 illustrates a plan view of a preferred form for the sensor chip of FIG. 1.

Referring now also to FIG. 3, therein is illustrated a plan view of a preferred form of the sensor of FIG. 1. The illustrated plan view of a pressure transducer 200 in accordance with the teachings of the present invention includes two sensors 220 and 230. Each of the sensors 220, 230 are of the type having serpentine or tortuous piezoresistors 221–224, 231–234 composed of highly doped P+ (or P++) silicon. Each piezoresistor 221–224, 231–234 is essentially a variable resistor in one of four legs of a Wheatstone bridge circuit with each of the respective resistances varying in proportion to an applied force or pressure to the transducer 200. The portions of the transducer 200 defined within the dotted lines 225, 235 are generally referred to as the "active areas" since these areas overlay regions of the diaphragms that deflect upon the application of a force thereto. The areas of the transducer 200 that are external to the active areas 225, 235 are termed the "non-active" areas. The difference in size between the active areas 225, 235 determines the difference between the operating spans of the sensors 220, 230 as has been set forth.

The four circuit nodes of the Wheatstone bridge consist of electrical contacts 226–229, 236–239 and which are located in the non-active areas of the transducer. Interconnecting the contacts 226–229, 236–239 with the piezoresistors 221–224, 231–234 are electrical interconnections 240, which are also P+ (or P++) silicon. These areas are all preferably formed simultaneously. It is noted that the contacts 226–229, 236–239 being doped P+ (or P++) are conductive, as are the interconnections 240, to provide electrical contact between the piezoresistors 221–224, 231–234 and the respective contacts. While the terms "electrical contacts" and "interconnections" are used for convenience, it is understood that these terms can be considered together to essentially consist of integral electrical contacts that interconnect the piezoresistor elements 221–224, 231–234 with the outside world. The interconnections 240 are wider than the piezoresistors 221–224, 231–234 to provide a low resistance path to the contacts 226–229, 236–239, while the long, tortuous lengths and narrow widths of the piezoresistors 221–224, 231–234 are designed to provide a desired resistance for those elements. External leads (not shown) can be readily attached to each contact 226–229, 236–239 to supply a bias voltage to two opposite nodes of the bridge and to externally measure the voltage between the two other nodes. The contacts and or the interconnections may also be coated with a metal film which lowers unwanted resistance and facilitates lead attachment thereto. The film can be formed by vapor deposition, sputtering or any other suitable method. The attachment of the external leads can be accomplished conventionally by any of a number of suitable techniques such as thermocompression bonding. One can then readily determine the applied pressure from the measured voltage.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

I claim:

1. A method for fabricating a single chip multiple range pressure transducer device from a wafer including first and second oppositely disposed sides, said method comprising the steps of:

identifying a plurality of operating ranges for said device;

determining a plurality of sets of dimensions, each of said sets defining a corresponding active area of said wafer being respectively associated with one of said operating ranges;

forming a plurality of piezoresistive circuits, each of said circuits being formed on said first side of said wafer and at least partially over a corresponding one of said active areas; and, simultaneously thinning said plurality of active areas starting from said second side of said wafer, each of said active areas having a substantially identical minimum thickness such that it deflects in response to an applied pressure so as to output a signal indicative of such applied pressure from said corresponding piezoresistive circuit over said respectively associated one of said operating ranges, wherein said step of thinning further simultaneously provides at least one fixed region between at least two of said active areas.

2. The method of claim 1, wherein said forming each of said piezoresistive circuits comprises forming a plurality of piezoresistors in Wheatstone bridge configuration.

3. The method of claim 2, further comprising providing means for selecting between said piezoresistive circuits dependently upon an amount of deflection of said active areas.

4. The method of claim 1, wherein said step of thinning comprises providing an overpressure stop for each of said active areas.

5. The method of claim 4, further comprising securing said second surface of said wafer to a support member.

* * * * *